(12) United States Patent
Wan

(10) Patent No.: US 12,193,265 B2
(45) Date of Patent: Jan. 7, 2025

(54) OLED DISPLAY PANEL AND ELECTRONIC DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Zhijun Wan, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 621 days.

(21) Appl. No.: 17/048,618

(22) PCT Filed: Sep. 8, 2020

(86) PCT No.: PCT/CN2020/113865
§ 371 (c)(1),
(2) Date: Oct. 19, 2020

(87) PCT Pub. No.: WO2022/027771
PCT Pub. Date: Feb. 10, 2022

(65) Prior Publication Data
US 2022/0045306 A1    Feb. 10, 2022

(30) Foreign Application Priority Data

Aug. 7, 2020 (CN) .......................... 202010786813.3

(51) Int. Cl.
*H10K 50/86*    (2023.01)
*H10K 59/122*    (2023.01)
*H10K 59/38*    (2023.01)

(52) U.S. Cl.
CPC ......... *H10K 50/865* (2023.02); *H10K 59/122* (2023.02); *H10K 59/38* (2023.02)

(58) Field of Classification Search
CPC .... H10K 59/35; H10K 59/351; H10K 50/865; H10K 50/856; H10K 59/122; H10K 59/38; H10K 50/15
See application file for complete search history.

(56) References Cited

U.S. PATENT DOCUMENTS 10,295,709 B2 *    5/2019  Hsu .................... G02B 5/003
10,340,315 B2 *    7/2019  Shim ................... H10K 50/17
(Continued)

FOREIGN PATENT DOCUMENTS

CN    1992329 A     7/2007
CN    103582201 A   2/2014
(Continued)

OTHER PUBLICATIONS

X. H. Wang, P. T. Lai, and H. W. Choi, "The contribution of sidewall light extraction to efficiencies of polygonal light-emitting diodes shaped with laser micromachining," J. Appl. Phys., vol. 108, No. 2, Art. No. 023110 (Year: 2010).*
IEEE Photonics Journal, vol. 14, No. 2, Apr. 2022 7014207 Tripling Light Conversion Efficiency of μLED Displays by Light Recycling Black Matrix Xiang Zhang, Anlan Chen, Tao Yang, Junhu Cai, Yuanyuan Ye, Enguo Chen , Sheng Xu, Yun Ye, Jie Sun , Senior Member, IEEE, Qun Yan, and Tailiang Guo (Year: 2022).*

*Primary Examiner* — Shaun M Campbell
(74) *Attorney, Agent, or Firm* — PV IP PC; Wei Te Chung

(57) ABSTRACT

An organic light-emitting diode (OLED) display panel and an electronic device are disclosed. The OLED display panel includes a display area having a light-emitting area and a non-light emitting area. The OLED display panel includes a cover. The cover includes a base layer, a color resist layer, a black matrix layer, a planarization layer, and a first optical compensation layer. The first optical compensation layer is located corresponding to the black matrix layer.

4 Claims, 3 Drawing Sheets

(56) References Cited

U.S. PATENT DOCUMENTS

| | | | |
|---|---|---|---|
| 11,075,364 B2* | 7/2021 | Kim | H10K 59/12 |
| 11,283,053 B2* | 3/2022 | Kim | H10K 50/858 |
| 11,489,145 B2* | 11/2022 | Bae | H10K 50/856 |
| 11,587,986 B2* | 2/2023 | Kim | H10K 50/856 |
| 2015/0069362 A1 | 3/2015 | Ito | |
| 2015/0188093 A1* | 7/2015 | Kim | H10K 59/122 |
| | | | 257/40 |
| 2016/0087245 A1 | 3/2016 | Park et al. | |
| 2018/0254437 A1 | 9/2018 | Kim et al. | |
| 2019/0280049 A1* | 9/2019 | Wang | H10K 50/856 |
| 2020/0168844 A1 | 5/2020 | Kim et al. | |
| 2020/0365776 A1* | 11/2020 | Sim | H10K 59/122 |
| 2021/0013452 A1* | 1/2021 | Kim | G06F 3/0446 |
| 2021/0335940 A1* | 10/2021 | Liang | H10K 71/00 |
| 2021/0408491 A1* | 12/2021 | Peng | H10K 50/858 |

FOREIGN PATENT DOCUMENTS

| | | | | |
|---|---|---|---|---|
| CN | 103777397 A | | 5/2014 | |
| CN | 103972262 A | * | 8/2014 | |
| CN | 109143677 A | * | 1/2019 | ....... G02F 1/133528 |
| CN | 110021647 A | | 7/2019 | |
| CN | 110854168 A | | 2/2020 | |
| CN | 111477764 A | | 7/2020 | |
| KR | 20200063591 A | | 6/2020 | |
| WO | WO-2012043172 A1 | * | 4/2012 | ........... G02B 6/0003 |

\* cited by examiner

OLED DISPLAY PANEL AND ELECTRONIC DEVICE

BACKGROUND OF INVENTION

1. Field of Invention

The present invention relates to a technical field of displays, and particularly to, an organic light-emitting diode (OLED) display panel and an electronic device.

2. Related Art

Organic light-emitting diode (OLED) display devices mainly include a bottom emission type (light emitting downward from a substrate) and a top emission type (light emitting upward from the substrate). Compared with bottom emission type OLEDs, top emission type OLEDs do not emit light through substrates, but from above devices, and have pixel circuit layouts on substrates not affecting light-emitting area of the devices, thereby avoiding conflict between thin-film transistors (TFTs) and metal circuit area and the light-emitting area over disposing areas, and effectively increasing aperture ratios of panels, so high-brightness and high-resolution OLED display panels can be prepared. At the same time, the top emission OLEDs have a lower operating voltage under the same brightness, so that the devices have a longer service life and lower power consumption.

In top emission OLED display devices, color filter (CF) covers are required for vapor-deposited white OLED (WOLED) devices to achieve full color display. For inkjet printing (IJP) side-by-side (SBS) OLED devices, CF covers will also be added to improve color purity of light. CF covers are composed of R, G, B color resists and black matrices. OLEDs emit light passing through R, G, and B color resists to achieve high-purity color, but part of light beam is irradiated on the black matrices, and most of the light irradiated on the black matrices is absorbed by the black matrices, while a small part is reflected, thereby reducing optical leakage of display panels, as well as reducing light extraction efficiency of the display panels.

SUMMARY OF INVENTION

An object of the present invention is to overcome a technical problem with current display panels that light beams being emitted are absorbed by black matrices, thereby reducing light extraction efficiency of the display panels.

To achieve the above-mentioned object, the present invention provides an organic light-emitting diode (OLED) display panel, comprising a display area and a non-display area provided around the display area, wherein the display area comprises a light-emitting area and a non-light emitting area around the light-emitting area, and a cover; wherein the cover comprises a base layer; a color resist layer disposed on a surface of the base layer corresponding to the light-emitting area; a black matrix layer disposed on a surface of the base layer and surrounding the color resist layer and located corresponding to the non-light emitting area; a planarization layer disposed on surfaces of the color resist layer and the black matrix layer away from the base layer; and a first optical compensation layer disposed on a surface of the planarization layer away from the black matrix layer and located in an area corresponding to the black matrix layer.

Further, the first optical compensation layer is distributed in a grid pattern.

Further, the first optical compensation layer has a plurality of regular quadrangular pyramids.

Further, the first optical compensation layer has an orthographic projection projected on the planarization layer and completely falling within an orthographic projection of the black matrix layer on the planarization layer.

Further, the OLED display panel further comprises a substrate disposed opposite to the cover; a pixel definition layer disposed on a surface of the substrate facing the cover; and a second optical compensation layer disposed on a surface of the pixel definition layer away from the substrate.

Further, the OLED display panel further comprises an anode layer disposed in a through hole provided by the pixel definition layer and laminated to the substrate; a light-emitting functional layer disposed on a surface of the pixel definition layer away from the substrate and extending to an inner wall and a bottom of the through hole, wherein the light-emitting functional layer in the through hole further comprises a light-emitting layer; and a cathode layer disposed on a surface of the light-emitting functional layer away from the pixel definition layer.

Further, the OLED display panel further comprises a substrate disposed opposite to the cover; a first barrier wall disposed on a surface of the substrate facing the cover and located in the non-light emitting area, wherein a first hollow chamber is defined by the first black barrier wall; and a second barrier wall disposed on a surface of the first barrier wall away from the substrate and located in the non-light emitting area to expose part of the first barrier wall, wherein a second hollow chamber is defined by the second barrier wall.

Further, the OLED display panel further comprises a second optical compensation layer disposed on a surface of the second barrier wall away from first barrier wall and corresponding to the black matrix layer.

Further, the OLED display panel further comprises an anode layer disposed in the first hollow chamber and laminated to the substrate; a light-emitting functional layer disposed in the first hollow chamber on a surface of the anode layer away from the substrate; an electron transport layer disposed on a surface of the second barrier wall away from the first barrier wall and extending to inner walls of the second hollow chamber and the first hollow chamber and a surface of the light-emitting functional layer away from the anode layer; and a cathode layer disposed on a surface of the electron transport layer away from the second barrier wall.

To achieve the above-mentioned object, the present invention further provides an electronic device, comprising the above-mentioned OLED display panel.

The present invention has advantageous effects as follows: by using the optical compensation layer to reflect light, light absorption by the black matrix layer is reduced, and number of light beams emitted from the color resist layer in the light-emitting area is increased, thereby further increasing light extraction efficiency of the OLED display panel.

BRIEF DESCRIPTION OF DRAWINGS

The following detailed description of the specific embodiments of the present invention with reference to the accompanying drawings will make the technical solutions and other beneficial effects of the present invention understandable.

DESCRIPTION OF PREFERRED EMBODIMENTS

Figure 1:
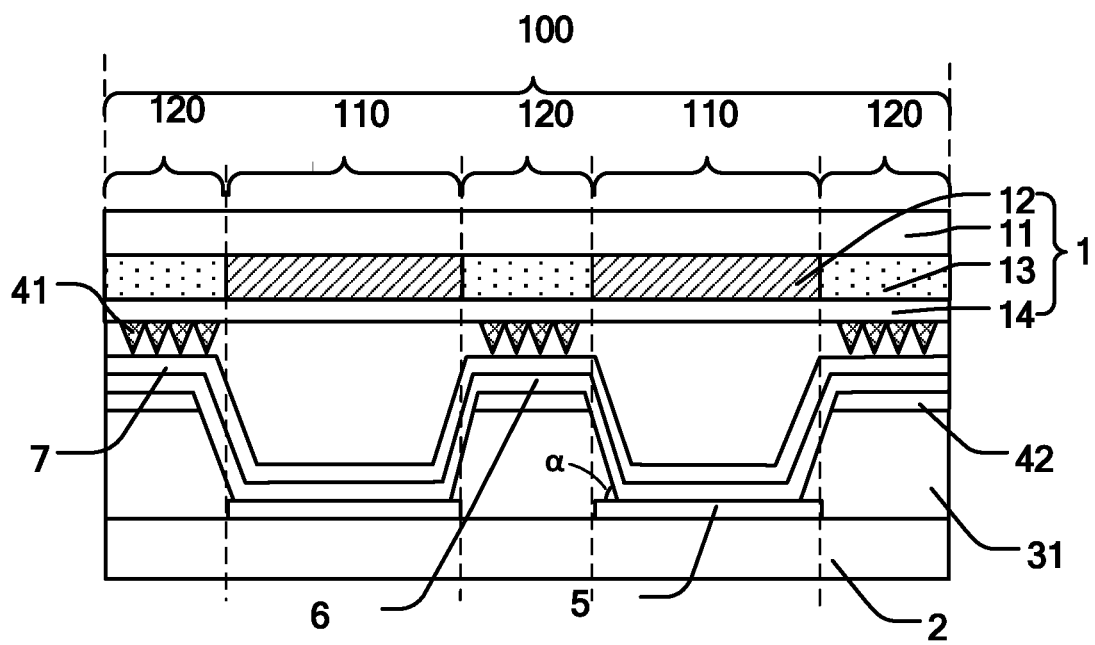
FIG. 1 is a schematic structural view of an organic light-emitting diode (OLED) display panel in accordance with a first embodiment of the present invention.

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

In the description of the present invention, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" indicates orientation or the orientation or positional relationship based on the positional relationship shown in the drawings, for convenience of description only and the present invention is to simplify the description, but does not indicate or imply that the device or element referred to must have a particular orientation in a particular orientation construction and operation, and therefore not be construed as limiting the present invention. Moreover, the terms "first" and "second" and the like are used for descriptive purposes only and are not to be construed as indicating or implying relative importance. Thus, features defining "first" or "second" may include one or more of the described features either explicitly or implicitly. In the description of the present invention, the meaning of "a plurality" is two or more unless specifically and specifically defined otherwise.

In the present invention, unless otherwise expressly specified or limited, the first feature being "on" or "lower" the second feature may include direct contact of the first and the second features and may also include that the first and the second features are not in direct contact, but in contact by the additional features therebetween. Also, the first feature being "on", "above", "upper" the second feature may include that the first feature is obliquely upward, directly above the second feature, or simply represent that a level of the first feature is higher than that of the second feature. The first feature being "beneath", "below" and "lower" the second feature may include that the first feature is obliquely downward and right below the second feature, or simply represent that a level of the first feature is less than that of the second feature.

The following disclosure provides many different embodiments or examples to achieve different structures of the present invention. To simplify the disclosure of the present invention, the components and configuration of specific examples are described hereinafter. Of course, they are only illustrative, and are not intended to limit the present invention. Further, the present disclosure may repeat reference numerals in different embodiments and/or the reference letters. This repetition is for the purpose of simplicity and clarity, and does not indicate a relationship between the various embodiments and/or set in question. Further, the present invention provides various specific examples of materials and processes, but one of ordinary skill in the art may be appreciated that other processes and applications and/or other materials.

Embodiment 1

Figure 2:
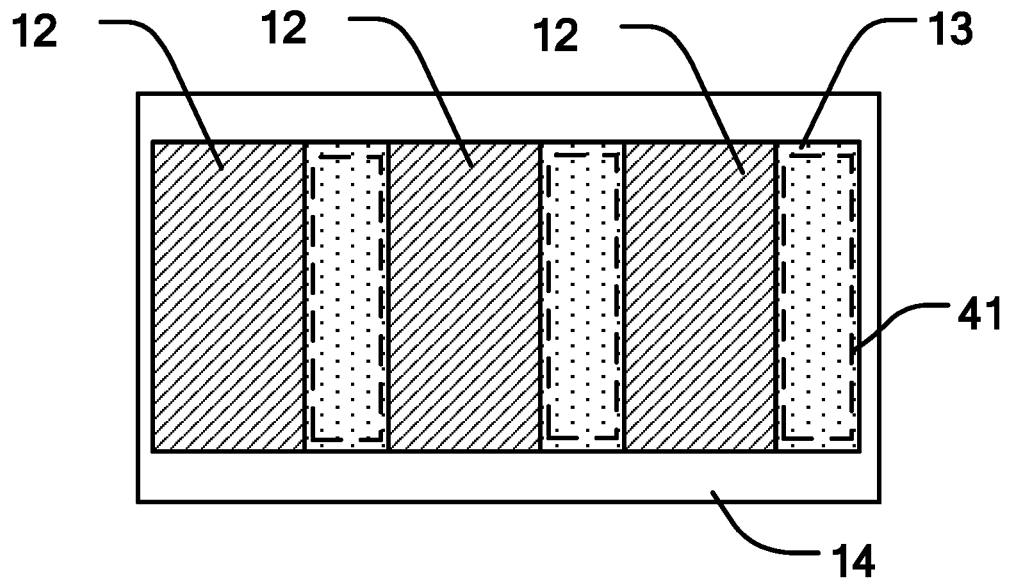
FIG. 2 is a top plan view of a cover in accordance with the first, a second, or a third embodiment of the present invention.
Figure 3:
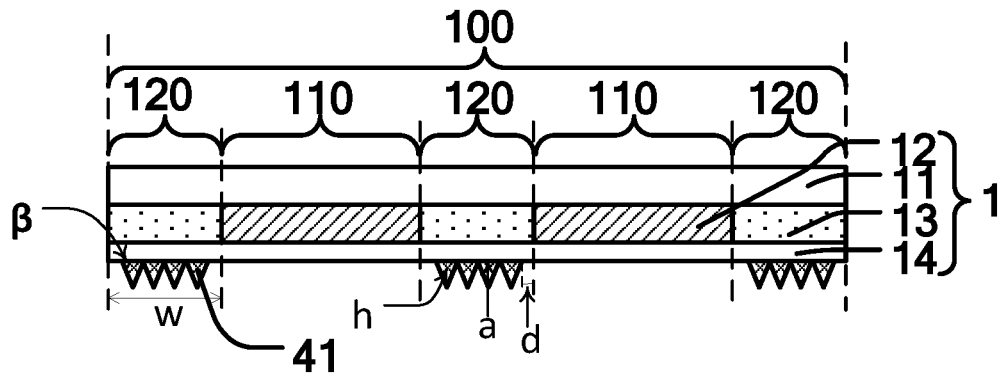
FIG. 3 is a schematic structural view of the cover in accordance with the first, a second, or a third embodiment of the present invention.

The embodiment provides an electronic device. The electronic device includes an organic light-emitting diode (OLED) display panel. As shown in FIGS. 1 to 3, the OLED display panel includes a display area 100 and a non-display area (not shown) provided around the display area 100. The display area 100 includes a light-emitting area 110 and a non-light emitting area 120 around the light-emitting area 110. The OLED display panel includes a cover 1, a substrate 2, a pixel definition layer 31, a first compensation optical layer 41, a second optical compensation layer 42, an anode layer 5, a light-emitting functional layer 6, and a cathode layer 7.

The cover 1 is a color filter cover and includes a base layer 11, a color resist layer 12, a black matrix layer 13, and a planarization layer 14. The cover 1 can improve color purity of light or achieve full color display of a display panel.

The base layer 11 is generally a glass substrate and serves as a base.

The color resist layer 12 is disposed on a surface of the base layer 11. In this embodiment, the color resist layer 12 is preferably disposed on a lower surface of the base layer 11 in the light-emitting area 110. The color resist layer 12 includes a red color resist, a green color resist, and a blue color resist. The color resist layer 12 functions as a color filter for color display of the display panel.

The black matrix layer 13 is disposed on a surface of the base layer 11 and located on the same side as the color resist layer 12. In this embodiment, the black matrix layer 13 is preferably disposed on the lower surface of the base layer 11 in the non-light emitting area 120. That is, the black matrix layer 13 is arranged between any two of the color resists. Every three adjacent color resists of colors different from one another and the black matrix layer arranged therebetween cooperatively define a color resist unit, thereby achieving color display.

The planarization layer 14 is disposed on surfaces of the color resist layer 12 and the black matrix layer 13 away from the base layer 11. In this embodiment, the planarization layer 14 is disposed on lower surfaces of the color resist layer 12 and the black matrix layer 13, thereby serving to make surfaces flat and smooth for tight lamination with subsequent formation of film layers.

The first optical compensation layer 41 is disposed in the non-light emitting area 120 and located in an area corresponding to the black matrix layer 13. The first optical compensation layer 41 is disposed on a surface of the planarization layer 14 away from the black matrix layer 13. In this embodiment, the first optical compensation layer 41 is preferably disposed on a lower surface of the planarization layer 14. The first optical compensation layer 41 is configured to reflect light, so that light absorption by the black matrix layer 13 can be reduced, enabling light directed to the black matrix layer 13 to be emitted from the light-emitting area 110, thereby increasing light extraction efficiency of the OLED display panel.

As shown in FIG. 2, from a macro perspective of the entire display panel, the first optical compensation layer 41 is distributed in a grid pattern. As shown in FIG. 3, the grid pattern distribution of the first optical compensation layer 41 is not in alignment with edges of the black matrix layer 13, so that two sides of the first optical compensation layer 41 will not exceed the edges of the black matrix layer 13. The first optical compensation layer 41 has an orthographic projection projected on the planarization layer 14 and completely falling within an orthographic projection of the black matrix layer 13 on the planarization layer 14. A distance from a side of the first optical compensation layer 41 to an adjacent edge of the black matrix layer 13 is defined as d, and a spacing between adjacent two of the light-emitting areas 110 is w, that is, a width of the non-light emitting area 120 is w, and 0.05w<d<0.2w. A proper distance d can effectively allow light beams emitted from the light-emitting area to strike directly from the light-emitting area 110 as much as possible, thereby improving a light emission rate.

The first optical compensation layer 41 is a metal film layer, which is characterized by high reflectivity. A lower surface of the first optical compensation layer 41 is provided with microstructures. Each of the microstructures has a regular quadrangular pyramid shape, which is triangular in shape in cross-section. The regular quadrangular pyramids are arranged in an array to form a grid-like structure and correspond in shape to each other. As shown in FIG. 3, each of the regular quadrangular pyramid shapes has a height h, and the height h is less than five microns. Each of the regular quadrangular pyramid shapes has a bottom length a, and the bottom length a is less than three microns. Four sides of each of the regular quadrangular pyramid shapes form an angle β with a bottom surface, respectively, and 20°<β<70°, so that light beams emitted from the light-emitting area can be effectively directed to strike directly from the light-emitting area 110 as much as possible, thereby improving a light emission rate.

The first optical compensation layer 41 is made of a material including at least one of nano silver ink, nano copper ink, or other nano metal ink. An average reflectivity of the first optical compensation layer 41 in visible light coupling is greater than 90%. The first optical compensation layer 41 can be made by imprinting technology. Specifically, a surface of the planarization layer 14 is coated with a metal material, and the microstructures with the regular quadrangular pyramid shape are formed on a surface of the metal material by imprinting technology.

As shown in FIG. 1, the substrate 2 and the cover 1 are disposed opposite to each other. The substrate 2 includes film layers such as an array layer. The array layer functions to control switching of circuits of the display panel.

The anode layer 5 is disposed on an upper surface of the substrate 2. The anode layer can be electrically connected to a source and drain layer of the array layer through an insulating layer, which are all known prior art. In this embodiment, this is not elaborated in detail.

The pixel definition layer 31 is disposed on an upper surface of the substrate 2 and is provided with a plurality of through holes. The through holes have a size configured to limit a size of the light-emitting area 110. A light-emitting material is filled in the through holes. An area where the through holes are formed in is defined as the light-emitting area 110, while part of the pixel definition layer 31 not hollowed out is not filled with the light-emitting area and is therefore defined as the non-light emitting area 120. The pixel definition layer 31 can be formed after a patterning process using a photolithography technology. A material of the pixel definition layer 31 is a hydrophilic photoresist material. An included angle α is formed between the pixel definition layer 31 and the substrate 2, wherein a value of the included angle α ranges from 20° to 70°.

The second optical compensation layer 42 is disposed on an upper surface of the pixel definition layer 31. Specifically, the second optical compensation layer 42 is disposed in the non-light emitting area 31 of the pixel definition layer 31. A material of the second optical compensation layer 42 is a hydrophilic or hydrophobic photoresist material. The second optical compensation layer 42 has a refractive index less than a refractive index of the light-emitting functional layer 6 and the pixel definition layer 31, so the light will be reflected when passing through the second optical compensation layer 42. The second optical compensation layer 42 and the first optical compensation layer 41 are disposed opposite to each other. After the light is reflected at the second optical compensation layer 42, the light will not be absorbed by the black matrix layer 13, thereby reducing the light absorption by the black matrix layer 13, so that after the light is reflected by the black matrix layer 13, the light is directed to pass through the light-emitting area 110, and the light extraction efficiency of the OLED display panel is increased.

The light-emitting functional layer 6 is disposed on surfaces of the second optical compensation layer 42 and the pixel definition layer 31 and extends to the through holes. The light-emitting function layer 6 uses carriers to realize light-emitting function. The light-emitting functional layer 6 includes film layers, such as a hole injection layer, a hole transport layer, a light-emitting layer, an electron transport layer, and an electron injection layer, wherein the light-emitting layer is only provided in the through holes to achieve a light-emitting effect.

The cathode layer 7 is disposed on an upper surface of the light-emitting functional layer. Regarding the cathode layer 7, it is known prior art, and in this embodiment, this is not elaborated in detail.

Part of light emitted by the light-emitting layer of the light-emitting functional layer 6 is passing through the color resist layer 12 in the light-emitting area 110, and other part is incident on the black matrix layer 13 in the non-light emitting area 120. The light beam incident on the black matrix layer 13 is reflected by the first optical compensation layer 41 located below the black matrix layer 13. Due to different reflection angles, part of the reflected light can directly pass through the color resist layer 12, and other part of the reflected light will be reflected to the light-emitting area 110 and directly interfere with the light beam generated by the light-emitting layer and then exit the light. Further, there is part of the reflected light incident on the non-light emitting area 120, with the light beam totally reflected at the second optical compensation layer 42, and then passing through the color resist layer 12, so that the light beam exiting from the color resist layer 12 is increased light extraction efficiency of the OLED display panel is improved.

The electronic device in this embodiment has technical effects as follows: a first optical compensation layer is added to the color filter cover under a black matrix layer, and a second optical compensation layer is added above a pixel definition layer, wherein the first optical compensation layer and the second optical compensation layer are not limited to hydrophilic or hydrophobic materials. By using the first and second optical compensation layers to reflect light, light absorption by the black matrix layer is reduced, and number of light beams emitted from a color resist layer in a light-emitting area is increased, thereby further increasing light extraction efficiency of the OLED display panel.

Embodiment 2

Figure 4:
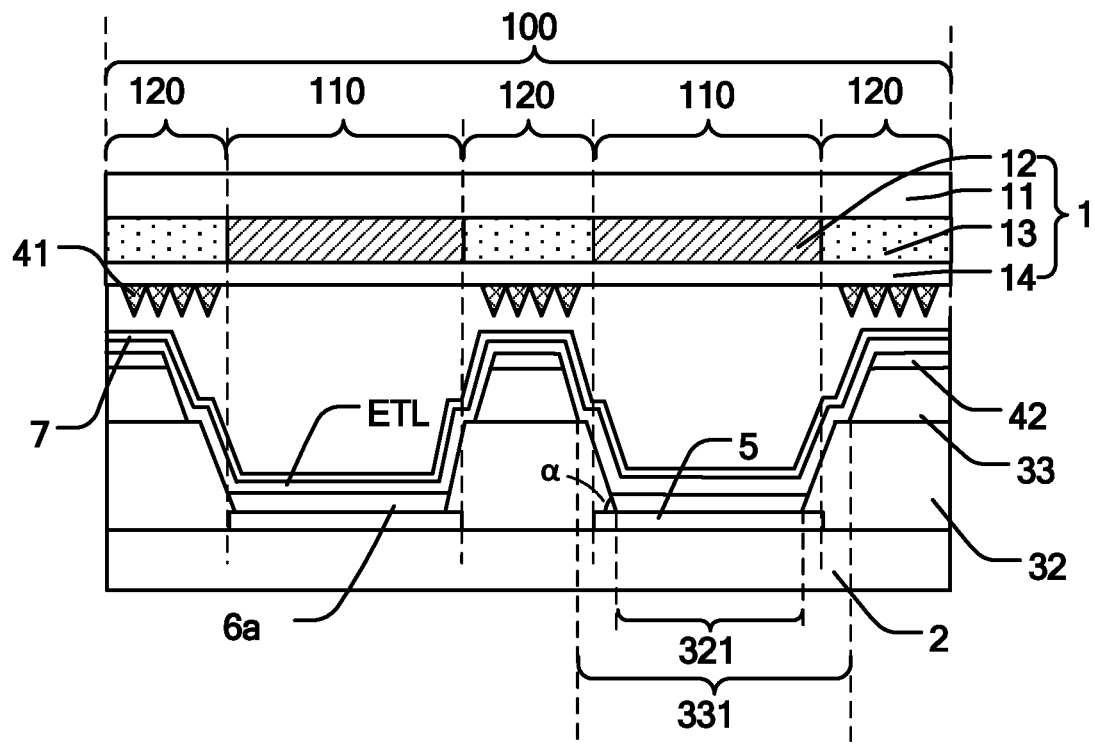
FIG. 4 is a schematic structural view of an OLED display panel in accordance with the second embodiment of the present invention.

The present embodiment provides an electronic device, including an organic light-emitting diode (OLED) display panel. As shown in FIGS. 2 to 4, the OLED display panel includes a display area 100 and a non-display area (not shown) provided around the display area 100. The display area 100 includes a light-emitting area 110 and a non-light emitting area 120 around the light-emitting area 110. The OLED display panel includes a cover 1, a substrate 2, a first barrier wall 32, a second barrier wall 33, a first optical compensation layer 41, a second optical compensation layer 42, an anode layer 5, a light-emitting functional layer 6a, and a cathode layer 7.

The cover 1 is a color filter cover and includes a base layer 11, a color resist layer 12, a black matrix layer 13, and a planarization layer 14. The cover 1 can improve color purity of light or achieve full color display of a display panel.

The base layer 11 is generally a glass substrate and serves as a base.

The color resist layer 12 is disposed on a surface of the base layer 11. In this embodiment, the color resist layer 12 is preferably disposed on a lower surface of the base layer 11 in the light-emitting area 110. The color resist layer 12 includes a red color resist, a green color resist, and a blue color resist. The color resist layer 12 functions as a color filter for color display of the display panel.

The black matrix layer 13 is disposed on a surface of the base layer 11 and located on the same side as the color resist layer 12. In this embodiment, the black matrix layer 13 is preferably disposed on the lower surface of the base layer 11 in the non-light emitting area 120. That is, the black matrix layer 13 is arranged between any two of the color resists. Every three adjacent color resists of colors different from one another and the black matrix layer arranged therebetween cooperatively define a color resist unit, thereby achieving color display.

The planarization layer 14 is disposed on surfaces of the color resist layer 12 and the black matrix layer 13 away from the base layer 11. In this embodiment, the planarization layer 14 is disposed on lower surfaces of the color resist layer 12 and the black matrix layer 13, thereby serving to make surfaces flat and smooth for tight lamination with subsequent formation of film layers.

The first optical compensation layer 41 is disposed in the non-light emitting area 120 and located in an area corresponding to the black matrix layer 13. The first optical compensation layer 41 is disposed on a surface of the planarization layer 14 away from the black matrix layer 13. In this embodiment, the first optical compensation layer 41 is preferably disposed on a lower surface of the planarization layer 14. The first optical compensation layer 41 is configured to reflect light, so that light absorption by the black matrix layer 13 can be reduced, enabling light directed to the black matrix layer 13 to be emitted from the light-emitting area 110, thereby increasing light extraction efficiency of the OLED display panel.

As shown in FIG. 2, from a macro perspective of the entire display panel, the first optical compensation layer 41 is distributed in a grid pattern. As shown in FIG. 3, the grid pattern distribution of the first optical compensation layer 41 is not in alignment with edges of the black matrix layer 13, so that two sides of the first optical compensation layer 41 will not exceed the edges of the black matrix layer 13. A distance from a side of the first optical compensation layer 41 to an adjacent edge of the black matrix layer 13 is defined as d, and a spacing between adjacent two of the light-emitting areas 110 is w, that is, a width of the non-light emitting area 120 is w, and 0.05w<d<0.2w. A proper distance d can effectively allow light beams emitted from the light-emitting area to strike directly from the light-emitting area 110 as much as possible, thereby improving a light emission rate.

The first optical compensation layer 41 is a metal film layer, which is characterized by high reflectivity. A lower surface of the first optical compensation layer 41 is provided with microstructures. Each of the microstructures has a regular quadrangular pyramid shape, which is triangular in cross-section. The regular quadrangular pyramids are arranged in an array to form a grid-like structure and correspond in shape to each other. As shown in FIG. 3, each of the regular quadrangular pyramid shapes has a height h, and the height h is less than five microns. Each of the regular quadrangular pyramid shapes has a bottom length a, and the bottom length a is less than three microns. Four sides of each of the regular quadrangular pyramid shapes form an angle β with a bottom surface, respectively, and 20°<β<70°, so that light beams emitted from the light-emitting area can be effectively directed to strike directly from the light-emitting area 110 as much as possible, thereby improving a light emission rate.

The first optical compensation layer 41 is made of a material including at least one of nano silver ink, nano copper ink, or other nano metal ink. An average reflectivity of the first optical compensation layer 41 in visible light coupling is greater than 90%. The first optical compensation layer 41 can be made by imprinting technology. Specifically, a surface of the planarization layer 14 is coated with a metal material, and the microstructures with the regular quadrangular pyramid shape are formed on a surface of the metal material by imprinting technology.

As shown in FIG. 4, the substrate 2 and the cover 1 are disposed opposite to each other. The substrate 2 includes film layers such as an array layer. The array layer functions to control switching of circuits of the display panel.

The anode layer 5 is disposed on an upper surface of the substrate 2. The anode layer can be electrically connected to a source and drain layer of the array layer through an insulating layer, which are all known prior art. In this embodiment, this is not elaborated in detail.

The OLED display panel described in this embodiment is an inkjet printing OLED device, so it needs to be structured with a double bank structure, that is, a double-layered barrier wall structure to prevent ink from overflowing during an inkjet printing process, as well as preventing other layers in the display area 100 from adverse effects.

The first barrier wall 32 is disposed on an upper surface of the substrate 2. The first barrier wall 32 is annular in shape and encloses to form a first hollow chamber 321. A size of the first hollow chamber 321 is configured to limit a size of the light-emitting area 110. A light-emitting material is filled in the first hollow chamber 321. An area where the first hollow chamber 321 is formed in is defined as the light-emitting area 110, while the first barrier wall 32 is not provided with the light-emitting material and is therefore defined as the non-light emitting area 120. The first barrier wall 32 can be formed after a patterning process using a photolithography technology. A material of the first barrier wall 32 is a hydrophilic photoresist material. An included angle α is formed between the first barrier wall 32 and the substrate 2, wherein a value of the included angle α ranges from 20° to 70°.

The second barrier wall 33 is disposed on an upper surface of the first barrier wall 32. The second barrier wall 33 is annular in shape and encloses to form a second hollow chamber 331. The second hollow chamber 331 exposes part of the first barrier wall 32, that is, the second hollow chamber 331 has a bottom area greater than a top area of the first hollow chamber 321 to facilitate subsequent formation of film layers in the hollow chambers. An included angle α is formed between the second barrier wall 33 and the substrate 2, wherein a value of the included angle α ranges from 20° to 70°.

The second optical compensation layer 42 is disposed on an upper surface of the pixel definition layer 31. Specifically, the second optical compensation layer 42 is disposed in the non-light emitting area 31 of the pixel definition layer 31.

In this embodiment, a material of the first barrier wall 32 is a hydrophilic photoresist material, and a material of the second barrier wall 33 is a hydrophobic photoresist material. A material of the second optical compensation layer 42 is also a hydrophobic photoresist material, and the second optical compensation layer 42 has a refractive index less than a refractive index of the electro transport layer and a refractive index of the second barrier wall 33, so the light will be reflected when passing through the second optical compensation layer 42. The second optical compensation layer 42 and the first optical compensation layer 41 are disposed opposite to each other. After the light is reflected at the second optical compensation layer 42, the light will not be absorbed by the black matrix layer 13, thereby reducing the light absorption by the black matrix layer 13, so that after the light is reflected by the black matrix layer 13, the light is directed to pass through the light-emitting area 110, and the light extraction efficiency of the OLED display panel is increased.

The light-emitting functional layer 6a is disposed in the first hollow chamber 321. An electron transport layer (ETL) is disposed on upper surfaces of the second optical compensation layer 42 and the second barrier wall 33 and extends to inner walls of the second hollow chamber 331 and the first hollow chamber 321 and an upper surface of the light-emitting functional layer 6a to achieve light-emitting effects.

The cathode layer 7 is disposed on an upper surface of the electron transport layer ETL. Regarding the cathode layer 7, it is known prior art, and in this embodiment, this is not elaborated in detail.

Part of light emitted by the light-emitting functional layer 6a is passing through the color resist layer 12 in the light-emitting area 110, and other part is incident on the black matrix layer 13 in the non-light emitting area 120. The light beam incident on the black matrix layer 13 is reflected by the first optical compensation layer 41 located below the black matrix layer 13. Due to different reflection angles, part of the reflected light can directly pass through the color resist layer 12, and other part of the reflected light will be reflected to the light-emitting area 110 and directly interfere with the light beam generated by the light-emitting layer and then exit the light. Further, there is part of the reflected light incident on the non-light emitting area 120, with the light beam totally reflected at the second optical compensation layer 42, and then passing through the color resist layer 12, so that the light beam exiting from the color resist layer 12 is increased light extraction efficiency of the OLED display panel is improved.

The electronic device in this embodiment has technical effects as follows: a first optical compensation layer is added to the color filter cover under a black matrix layer, and a second optical compensation layer is added above a first barrier wall and a second barrier wall. By using the first and second optical compensation layers to reflect light, light absorption by the black matrix layer is reduced, and number of light beams emitted from a color resist layer in a light-emitting area is increased, thereby further increasing light extraction efficiency of the OLED display panel.

Embodiment 3

Figure 5:
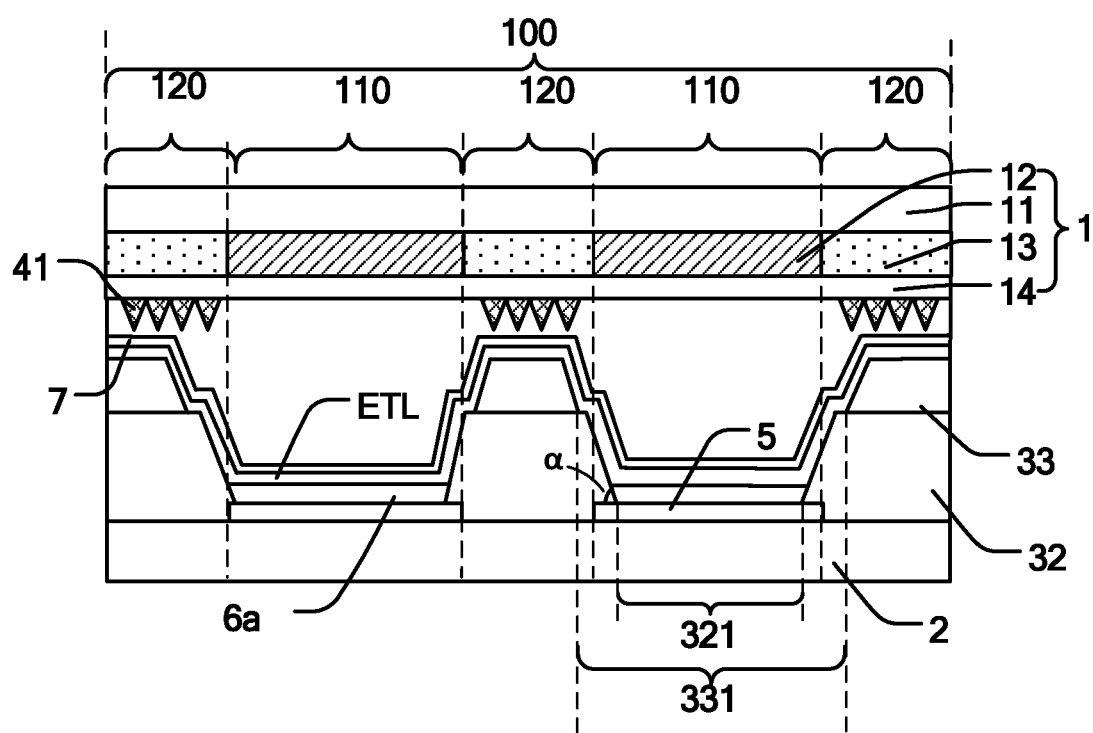
FIG. 5 is a schematic structural view of an OLED display panel in accordance with the third embodiment of the present invention.

As shown in FIG. 5, compared with the above-mentioned second embodiment, an OLED display panel provided in this embodiment differs in that, in this embodiment, the OLED display panel includes a display area 100 and a non-display area (not shown) provided around the display area 100. The display area 100 includes a light-emitting area 110 and a non-light emitting area 120. The OLED display panel includes a cover 1, a substrate 2, a first barrier wall 32, a second barrier wall 33, a first optical compensation layer 41, an anode layer 5, a light-emitting functional layer 6a, and a cathode layer 7.

No second optical compensation layer 42 is added. In this manner, the second barrier wall 33 also functions as the second optical compensation layer 42 in the second embodiment. A material of the first barrier wall 32 is a hydrophilic photoresist material, and a material of the second barrier wall 33 is a hydrophobic photoresist material. The second barrier 33 has a refractive index less than refractive indexes of both the electron transport layer ETL and the first barrier wall 32.

The electronic device in this embodiment has technical effects as follows: a first optical compensation layer is added to the color filter cover under a black matrix layer. By using the first optical compensation layer to reflect light, light absorption by the black matrix layer is reduced, and number of light beams emitted from a color resist layer in a light-emitting area is increased, thereby further increasing light extraction efficiency of the OLED display panel. There is no need to add a second optical compensation layer in this embodiment. The second barrier wall further functions as the second optical compensation layer, thereby simplifying a panel structure, without adversely affecting a light output ratio of the OLED display panel.

In the above-mentioned embodiments, the description of each embodiment has its own focus. For parts that are not described in detail in an embodiment, reference may be made to related descriptions of other embodiments.

The OLED display panel and the electronic device provided by the embodiments of the present invention are described in detail above. It is understood that the exemplary embodiments described herein are to be considered as illustrative only, and are not intended to limit the invention. Descriptions of features or aspects in each exemplary embodiment should generally be considered as suitable features or aspects in other exemplary embodiments. While the invention has been described with reference to the preferred embodiments thereof, various modifications and changes can be made by those skilled in the art. The invention is intended to cover such modifications and modifications within the scope of the appended claims.

What is claimed is:

1. An OLED display panel, comprising a display area, wherein the display area comprises a light-emitting area and a non-light emitting area around the light-emitting area, and a cover;
wherein the cover comprises:
a base layer;
a color resist layer disposed on a surface of the base layer corresponding to the light-emitting area;
a black matrix layer disposed on a surface of the base layer and surrounding the color resist layer and located corresponding to the non-light emitting area; and
a planarization layer disposed on surfaces of the color resist layer and the black matrix layer away from the base layer, wherein the OLED display panel further comprises:
a first optical compensation layer disposed on a surface of the planarization layer away from the black matrix layer and located in an area corresponding to the black matrix layer;
a substrate disposed opposite to the cover;
a first barrier wall disposed on a surface of the substrate facing the cover and located in the non-light emitting area, wherein a first hollow chamber is defined by the first barrier wall;
a second barrier wall disposed on the surface of the first barrier wall away from the substrate and located in the non-light emitting area to expose part of the first barrier wall, wherein a second hollow chamber is defined by the second barrier wall;
an anode layer disposed in the first hollow chamber and laminated to the substrate;
a light-emitting functional layer disposed in the first hollow chamber on a surface of the anode layer away from the substrate;
an electron transport layer disposed on a surface of the second barrier wall away from the first barrier wall and extending to inner walls of the second hollow chamber and the first hollow chamber and a surface of the light-emitting functional layer away from the anode layer; and
a cathode layer disposed on a surface of the electron transport layer away from the second barrier wall,
wherein the second barrier wall has a refractive index less than the refractive index of the first barrier wall,
wherein the first optical compensation layer has a plurality of regular quadrangular pyramids.

2. The OLED display panel of claim 1, wherein the first optical compensation layer has an orthographic projection projected on the planarization layer and completely falling within an orthographic projection of the black matrix layer on the planarization layer.

3. An electronic device, comprising an OLED display panel, comprising a display area, wherein the display area comprises a light-emitting area and a non-light emitting area around the light-emitting area, and a cover;
wherein the cover comprises:
a base layer;
a color resist layer disposed on a surface of the base layer corresponding to the light-emitting area;
a black matrix layer disposed on a surface of the base layer and surrounding the color resist layer and located corresponding to the non-light emitting area; and
a planarization layer disposed on surfaces of the color resist layer and the black matrix layer away from the base layer, wherein the OLED display panel further comprises:
a first optical compensation layer disposed on a surface of the planarization layer away from the black matrix layer and located in an area corresponding to the black matrix layer;
a substrate disposed opposite to the cover;
a first barrier wall disposed on a surface of the substrate facing the cover and located in the non-light emitting area, wherein a first hollow chamber is defined by the first barrier wall;
a second barrier wall disposed on the surface of the first barrier wall away from the substrate and located in the non-light emitting area to expose part of the first barrier wall, wherein a second hollow chamber is defined by the second barrier wall;
an anode layer disposed in the first hollow chamber and laminated to the substrate;
a light-emitting functional layer disposed in the first hollow chamber on a surface of the anode layer away from the substrate;
an electron transport layer disposed on a surface of the second barrier wall away from the first barrier wall and extending to inner walls of the second hollow chamber and the first hollow chamber and a surface of the light-emitting functional layer away from the anode layer; and
a cathode layer disposed on a surface of the electron transport layer away from the second barrier wall,
wherein the second barrier wall has a refractive index less than the refractive index of the first barrier wall,
wherein the first optical compensation layer has a plurality of regular quadrangular pyramids.

4. The OLED display panel of claim 1, wherein the first optical compensation layer is distributed in a grid pattern.

* * * * *